United States Patent [19]
Rossi et al.

[11] 3,967,205
[45] June 29, 1976

[54] FREQUENCY DIVIDING NETWORK WITH ODD INTEGRAL STEP-DOWN RATIO

[75] Inventors: Umberto Rossi, Milan; Pietro Basili, Pedaso, both of Italy

[73] Assignee: Societa Italiana Telecommunicazioni Siemens S.p.A., Milan, Italy

[22] Filed: June 5, 1975

[21] Appl. No.: 583,903

[30] Foreign Application Priority Data
June 6, 1974  Italy .................................. 23674/74

[52] U.S. Cl. .................................... 328/46; 328/48
[51] Int. Cl.² .................... H03K 21/06; H03K 21/36
[58] Field of Search .............................. 328/46, 48

[56] References Cited
UNITED STATES PATENTS

| | | |
|---|---|---|
| 3,044,065 | 7/1962 | Barney et al. ...................... 328/48 X |
| 3,409,761 | 11/1968 | Becker ............................... 328/46 X |
| 3,546,597 | 12/1970 | Lipke .................................... 328/46 |
| 3,576,496 | 4/1971 | Garagnon ......................... 328/48 X |
| 3,818,354 | 6/1974 | Tomisawa et al. ................ 328/48 X |

Primary Examiner—John S. Heyman
Attorney, Agent, or Firm—Karl F. Ross; Herbert Dubno

[57] ABSTRACT

In order to convert a basic frequency by an odd integer $K = 2n\pm 1$, a square wave of that basic frequency is fed alternately over a noninverting and an inverting branch of a switching circuit to a pulse counter working into a decoder which emits a resetting pulse for the counter on every $n^{th}$ cycle. A flip-flop alternately set and reset by successive setting pulses feeds back a control signal to the switching circuit for a periodic reversal of the polarity of the incoming square wave either in the middle of the $n^{th}$ cycle, for $K = 2n-1$, or after a half-cycle delay from the end of the $n^{th}$ cycle, for $K = 2n+1$.

5 Claims, 5 Drawing Figures ns, the produced by the second output lead of A gate A₁—acting now as a cut-off gate—remains ineffective until an instant $t_3$, midway between $t_2$ and the next zeroization by another spike $q_5$ at an instant $t_4$.

FREQUENCY DIVIDING NETWORK WITH ODD INTEGRAL STEP-DOWN RATIO

FIELD OF THE INVENTION

Our present invention relates to a frequency-dividing network designed to step down the frequency of an original square wave to an aliquot fraction of its value, more particularly in a ratio 1:K where K is an odd integer.

BACKGROUND OF THE INVENTION

In data-transmission systems, for example, operating speeds of 200 bits per second are conventionally used in the signaling modems. Such a bit cadence can be obtained from a basic frequency of 1221 kHz, delivered by a crystal-controlled oscillator, through frequency division by K = 6105. This type of step-down ratio can be realized with combinations of binary frequency dividers, e.g. as disclosed in commonly owned U.S. Pat. No. 3,659,266; such division, however, involves a certain degree of distortion.

OBJECT OF THE INVENTION

It is, therefore, the object of our present invention to provide a frequency-dividing network, operating with an odd integral step-down ratio, adapted to derive an outgoing square wave of reduced frequency in a substantially distortion-free manner from an incoming square wave which may serve as a master oscillation for the generation of a number of lower frequencies for different transmission channels.

SUMMARY OF THE INVENTION

This object is realized, in accordance with our present invention, by the provision of an input circuit provided with polarity-inverting means, this circuit delivering the incoming high-frequency square wave to a binary counter working into a decoder. Upon the occurrence of a predetermined number of half-cycles of the incoming square wave, the decoder generates a control pulse which is delivered on the one hand to a resetting input for the binary counter and on the other hand to a bistable circuit for alternate switchover between a first and a second operating condition by that control pulse, thereby producing the desired outgoing square wave of reduced frequency. A feedback path extends from the bistable circuit to the polarity-inverting means of the input circuit for activating and deactivating same in dependence upon the operating conditions of the bistable circuit to provide a polarity reversal after every K half-cycles of the incoming square wave.

With such a circuit arrangement it is possible to establish a divisor $K = 2n-1$ by making the decoder responsive to a stepping of the binary counter in the middle of the $n^{th}$ cycle of the incoming square wave. For this purpose, the counter may consist of a plurality of cascaded flip-flops, the first-stage flip-flop being switchable by the trailing edge of a pulse of predetermined polarity constituting the first half of any cycle of the incoming square wave. Alternately, the decoder may respond to a stepping of the binary counter at the end of the $n^{th}$ cycle, the first-stage flip-flop of the counter being then switchable by the trailing edge of a pulse of the opposite polarity constituting the second half of a cycle of the incoming square wave; in the latter instance, the decoder may be provided with delay means for retarding its control pulse by half a cycle beyond the end of the $n^{th}$ cycle to establish a divisor $K = 2n+1$.

BRIEF DESCRIPTION OF THE DRAWING

The above and other features of our invention will now be described in detail with reference to the accompanying drawing in which.

SPECIFIC DESCRIPTION

Figure 1:
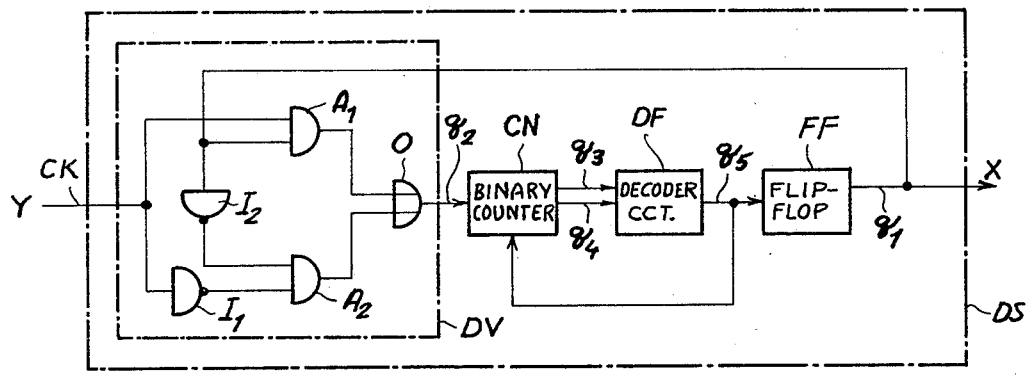
FIG. 1 is a block diagram of a frequency divider embodying our invention.

The frequency-dividing network DS shown in FIG. 1 comprises a switching circuit DV with two parallel branches, i.e. a first branch including an AND gate $A_1$ and a second branch including an AND gate $A_2$ preceded by an inverter $I_1$. An output lead X of network DS feeds back an outgoing square wave $q_1$ to the other inputs of AND gates $A_1$ and $A_2$, with interposition of a second inverter $I_2$ in the case of gate $A_2$. The output leads of AND gates $A_1$ and $A_2$ terminate at an OR gate O which, in the presence of an incoming square wave CK (i.e. a train of clock pulses) on an input lead Y of circuit DV, delivers a modified square wave $q_2$ to a binary counter CN with stage outputs $q_3$ and $q_4$ extending to a decoder DF. The latter generates a spike $q_5$ whenever the counter CN reaches a predetermined setting, spike $q_5$ constituting a control pulse which on the one hand resets the counter CN to zero and on the other hand alternately sets and resets a flip-flop FF emitting the outgoing square wave $q_1$.

Figure 2:
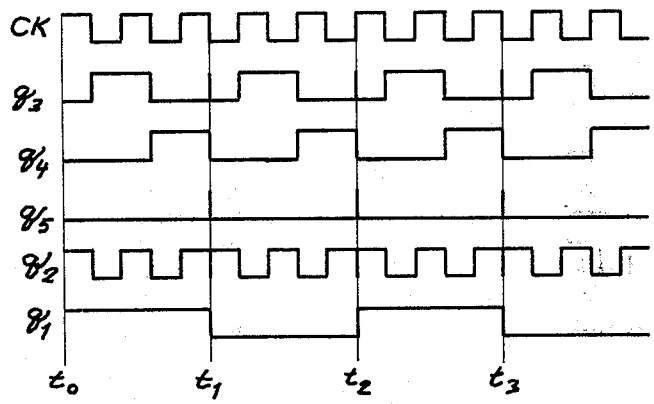
FIG. 2 is a set of graphs relating to the operation of the system of FIG. 1.

In the specific case here described, as illustrated by the waveforms of FIG. 2, the divisor $K = 2n-1$ has the value 5, with $n = 3$.

Figure 5:
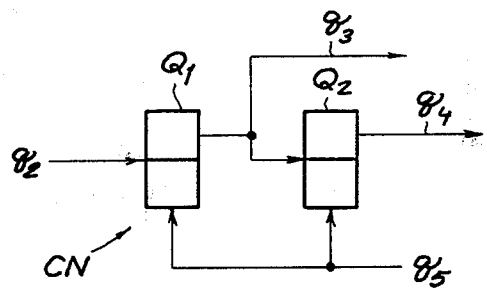
FIG. 5 is a more detailed circuit diagram of a binary counter included in the systems of FIGS. 1 and 3.

As shown in FIG. 5, counter CN consists of two cascaded binary stages, i.e. a first flip-flop $Q_1$ and a second flip-flop $Q_2$. Let it be assumed that flip-flop FF is set at an instant $t_0$ so that its output $q_1$ unblocks the gate $A_1$ and, via inverter $I_2$, blocks the gate $A_2$. The incoming square wave CK thus passes unchanged through gates $A_1$ and O to step the counter CN, i.e. to reverse its flip-flop $Q_1$ on the trailing edge of every positive clock pulse. This results in a stage output $q_3$ which, on the trailing edge of its positive pulse, reverses the flip-flop $Q_2$ to provide another stage output $q_4$. At an instant $t_1$, occurring 2½ cycles after instant $t_0$, decoder DF detects the coincidence of pulses $q_3$ and $q_4$ to generate a spike $q_5$ which immediately zeroizes the counter by resetting its stages $Q_1$, $Q_2$ jointly with flip-flop FF. The latter operation reverses the state of conductivity of gates $A_1$ and $A_2$ whereby square wave CK can no longer directly reach the OR gate O but is transmitted to it via inverter $I_1$ in series with gate $A_2$. Thus, the signal $q_2$ in the input of counter CN is now in phase opposition with reference to wave CK so that the counter is restarted half a cycle later, tripping the decoder DF at an instant $t_2$ to emit another control pulse $q_5$ which again sets the flip-flop FF, zeroizes the counter CN and restores the original switching condition of input circuit DV. During the next 2½ cycles of square wave CK in the interval $t_2 - t_3$, therefore, the operation is the same as in the initial period $t_0 - t_1$.

It will be evident that the system shown in FIG. 1 may be expanded at will to increase the value of $n$, and therefore of K, for the establishment of any desired step-down ratio satisfying the relationship $K = 2n-1$ where $n$ is any integer.

The system of FIG. 3 differs from that of FIG. 1 by the presence of a delay circuit RS in the output of decoder DS, circuit RS receiving from the decoder a series of spikes $q_5$ and transmitting them half a cycle later, as control pulses $q_6$, to the switching input of flip-flop FF and to the zero-setting input of binary counter CN.

Figure 4:
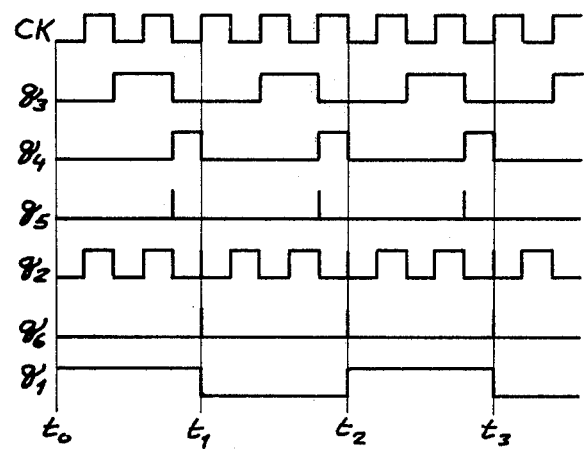
FIG. 4 is a set of graphs similar to FIG. 2, relating to the operation of the system of FIG. 3.

As shown in FIG. 4, a spike $q_5$ comes into existence on the leading edge of the second-stage output $q_4$ of counter CN coinciding with the trailing edge of first-stage output $q_3$, i.e. immediately upon the occurrence of the condition $q_3 \cdot q_4$. In this simple instance it would be sufficient to extend one of these stage outputs to the decoder DF; in fact, the counter could be designed as single flip-flop switchable by the trailing edge of each positive pulse of incoming square wave CK. With larger values of K, however, the counter will also consist in this embodiment of a plurality of cascaded bistable stages having output connections to the associated decoder which detects a predetermined logical combination of their respective signals.

Owing to the provision of delay circuit RS, control pulses $q_6$ again occur at instances $t_1$, $t_2$, $t_3$ . . . at intervals of 2½ cycles of incoming square wave CK. Each control pulse again results in a polarity reversal in switching cicuit DV, as described with reference to FIG. 1, so that signal $q_2$ is again a pulse train alternately in phase and in phase opposition with the incoming wave CK. As before, the factor K has a value of 5, but in this instance $R = 2n+1$ with $n = 2$.

Figure 3:
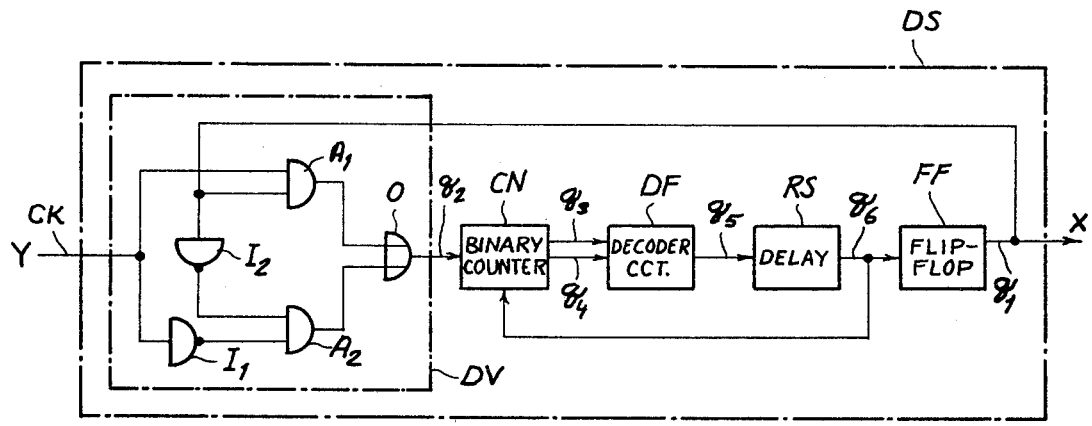
FIG. 3 is a block diagram similar to that of FIG. 1, illustrating a modification.

The embodiment of FIGS. 3 and 4 could also operate, albeit less accurately, if the decoder pulses $q_5$ occurred earlier in each switching interval $t_0 - t_1$ etc., with a corresponding lengthening of the delay period in circuit RS.

We claim:

1. A frequency-dividing network with a step-down ratio of 1:K where K is an odd integer, comprising:

an input circuit connected to receive an incoming square wave of a basic frequency to be divided, said input circuit being provided with polarity-inverting means;

a binary counter connected to said input circuit for receiving said incoming square wave therefrom;

decoding means connected to said binary counter for generating a control pulse upon the occurrence of a predetermined number of half-cycles of said incoming square wave;

resetting means for said binary counter connected to said decoding means and responsive to said control pulse;

bistable means connected to said decoding means for alternate switchover between a first and a second operating condition by said control pulse, thereby producing an outgoing square wave of reduced frequency; and feedback means extending from said bistable means to said polarity-inverting means for activating and deactivating same in dependence upon the operating condition of said bistable means to provide a polarity reversal after every K half-cycles of said incoming square wave.

2. A network as defined in claim 1 wherein said input circuit is provided with two parallel branches, one of said branches including said polarity-inverting means, and with gating means controlled by said feedback means for alternately routing said incoming square wave over said branches.

3. A network as defined in claim 1 wherein $K = 2n-1$, said decoding means being responsive to a stepping of said binary counter in the middle of the $n^{th}$ cycle of said incoming square wave.

4. A network as defined in claim 1 wherein $K = 2n+1$, said decoding means being responsive to a stepping of said binary counter at the end of the $n^{th}$ cycle of said incoming square wave, said decoding means being provided with delay means for retarding said control pulse by half a cycle of said incoming square wave beyond the end of said $n^{th}$ cycle.

5. A network as defined in claim 1 wherein said binary counter consists of a plurality of cascaded bistable stages.

* * * * *

UNITED STATES PATENT AND TRADEMARK OFFICE
CERTIFICATE OF CORRECTION

PATENT NO. : 3,967,205
DATED : 29 June 1976
INVENTOR(S) : Umberto Rossi et al

It is certified that error appears in the above-identified patent and that said Letters Patent are hereby corrected as shown below:

Column 1, line 21, change "3,659,266" to -- 3,659,226 --.

Signed and Sealed this

Twentieth Day of May 1980

[SEAL]

Attest:

SIDNEY A. DIAMOND

Attesting Officer    Commissioner of Patents and Trademarks